US008967586B2

(12) United States Patent
Zhu et al.

(10) Patent No.: US 8,967,586 B2
(45) Date of Patent: Mar. 3, 2015

(54) HEAT DISSIPATING DEVICE SUPPORTING APPARATUS

(75) Inventors: Chao-Jun Zhu, Wuhan (CN); Jin-Biao Ji, Wuhan (CN); Zhi-Jiang Yao, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 298 days.

(21) Appl. No.: 13/456,490

(22) Filed: Apr. 26, 2012

(65) Prior Publication Data

US 2013/0048820 A1    Feb. 28, 2013

(30) Foreign Application Priority Data

Aug. 22, 2011    (CN) .......................... 2011 1 0241332

(51) Int. Cl.
| | |
|---|---|
| *F16M 1/00* | (2006.01) |
| *H05K 7/20* | (2006.01) |
| *F28F 3/06* | (2006.01) |
| *H01L 23/36* | (2006.01) |
| *H01L 23/40* | (2006.01) |

(52) U.S. Cl.
CPC . *F28F 3/06* (2013.01); *H01L 23/36* (2013.01); *H01L 23/4006* (2013.01)
USPC ........... 248/637; 248/671; 248/682; 248/672; 248/673; 248/674; 248/678; 361/688; 361/697; 361/703; 361/695; 361/709; 361/704; 361/710; 361/719; 165/80.3; 165/185; 165/104.33; 411/111; 411/112; 411/432; 411/103; 411/104; 411/105; 411/107; 411/108; 411/508

(58) Field of Classification Search
USPC ......... 248/637, 671, 682, 672, 673, 674, 678; 361/688, 697, 703, 695, 709, 704, 710, 361/719, 921; 165/80.3, 185, 104.33; 411/111, 112, 432, 103, 104, 105, 107, 411/108, 508
See application file for complete search history.

(56) References Cited

U.S. PATENT DOCUMENTS

| | | | | | |
|---|---|---|---|---|---|
| 5,524,860 | A  * | 6/1996  | Ives | ............................... | 248/674 |
| 7,180,743 | B2 * | 2/2007  | Chen et al. | .................... | 361/704 |
| 7,283,368 | B2 * | 10/2007 | Wung et al. | ................... | 361/719 |
| 7,342,795 | B2 * | 3/2008  | Lee et al. | ....................... | 361/719 |
| 7,609,522 | B2 * | 10/2009 | Jin et al. | ........................ | 361/710 |
| 7,808,791 | B2 * | 10/2010 | Li et al. | .......................... | 361/719 |
| 8,122,945 | B2 * | 2/2012  | Kuo et al. | ..................... | 165/80.3 |
| 2003/0159819 | A1* | 8/2003 | Lee | ................. | 165/185 |
| 2008/0055858 | A1* | 3/2008 | Hu et al. | ....................... | 361/704 |

(Continued)

*Primary Examiner* — Christopher Garft
(74) *Attorney, Agent, or Firm* — Novak Druce Connolly Bove + Quigg LLP

(57) ABSTRACT

A supporting apparatus, configured to support a heat dissipating device, includes a bracket, two adjusting structures, and two mounting portions. Each of the two mounting portions defines a mounting hole. Each of the two adjusting structures is engaged in each of the mounting holes and includes an adjusting member and an installation member engaged with the adjusting member. Each of the adjusting members defines a through hole. The two adjusting members are rotatable relative to the two mounting portions from a first position to a second position. When the adjusting members are in the first position, a first line is running through the two through holes. When the adjusting members are in the second position, a second line is running through the two through holes, and a length of the first line is less than a length of the second line.

20 Claims, 7 Drawing Sheets

(56) References Cited

U.S. PATENT DOCUMENTS

| | | | |
|---|---|---|---|
| 2008/0130233 A1* | 6/2008 | Jin et al. | 361/704 |
| 2008/0174952 A1* | 7/2008 | Ye et al. | 361/687 |
| 2009/0290309 A1* | 11/2009 | Zha | 361/709 |
| 2010/0246132 A1* | 9/2010 | Cao et al. | 361/704 |
| 2013/0094923 A1* | 4/2013 | Branning et al. | 411/432 |

* cited by examiner

HEAT DISSIPATING DEVICE SUPPORTING APPARATUS

BACKGROUND

1. Technical Field

The present disclosure relates to supporting apparatuses, and particularly to a supporting apparatus for a heat dissipating device.

2. Description of Related Art

A heat dissipating device is mounted on a motherboard of an electronic device, such as a computer or a server, for dissipating heat generated from electronic components in the electronic device. A bracket is provided to support the heat dissipating device. The motherboard defines a plurality of installation holes, and the bracket defines a plurality of mounting holes. The plurality of mounting holes are aligned with the plurality of the installation holes. A plurality of fixing members are inserted into the plurality of mounting holes and the plurality of corresponding installation holes. Thus, the dissipating device is installed on the motherboard. However, the plurality of installation holes may be defined in different positions of motherboards with different configurations, and the bracket needs to be designed accordingly. Such additional design requirements of the brackets may increase manufacturing cost.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
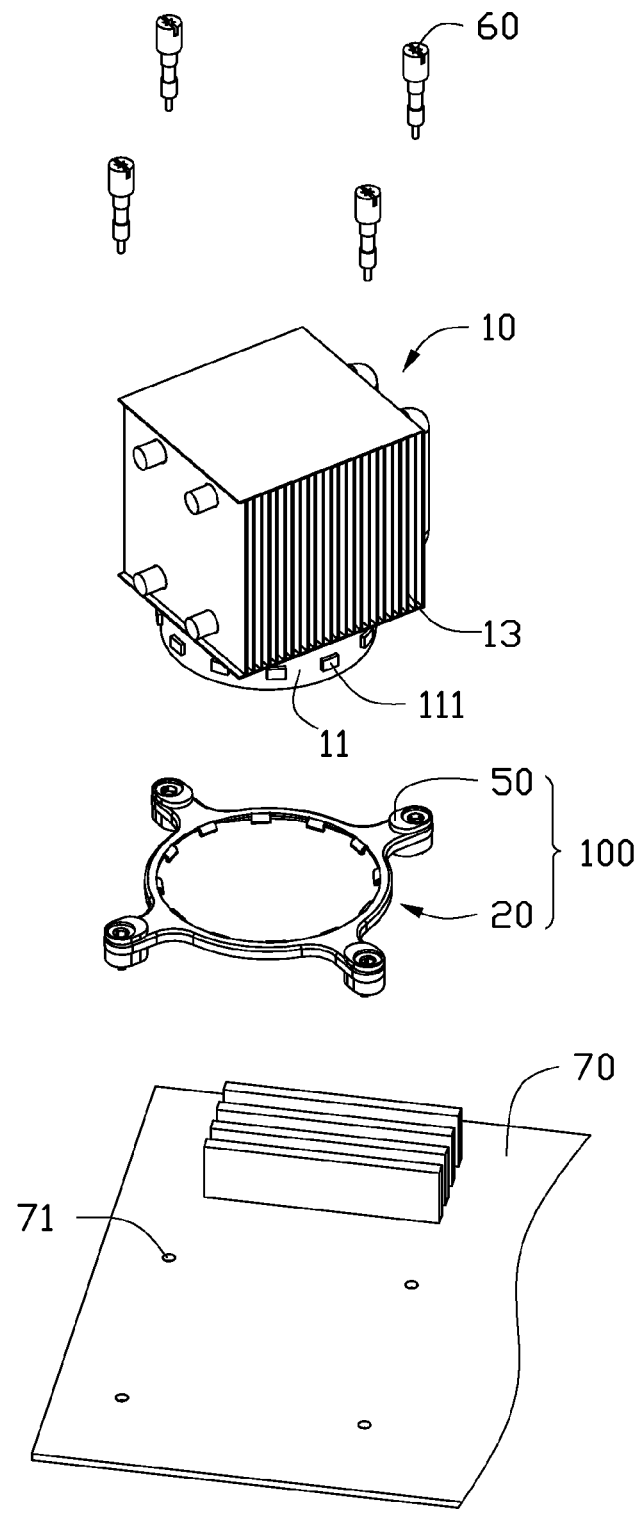
FIG. 1 is an exploded, isometric view of an embodiment of a supporting apparatus, a heat dissipating device, a first circuit board and four fixing members.

FIG. 1 is an embodiment of a supporting apparatus 100 for supporting a heat dissipating device 10, including a bracket 20 and four adjusting structures 50.

The heat dissipating device 10 includes a base 11 and a plurality of fins 13 secured to the base 11. A plurality of stopping portions 111 protrude from an outer surface of the base 11.

Figure 2:
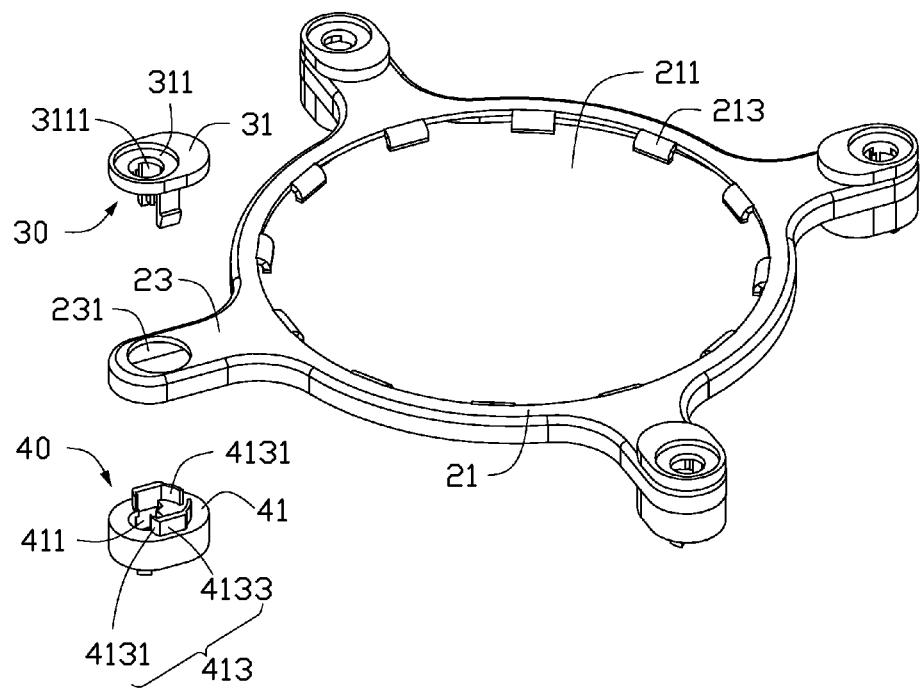
FIG. 2 is an exploded, isometric view of the supporting apparatus of FIG. 1.
Figure 3:
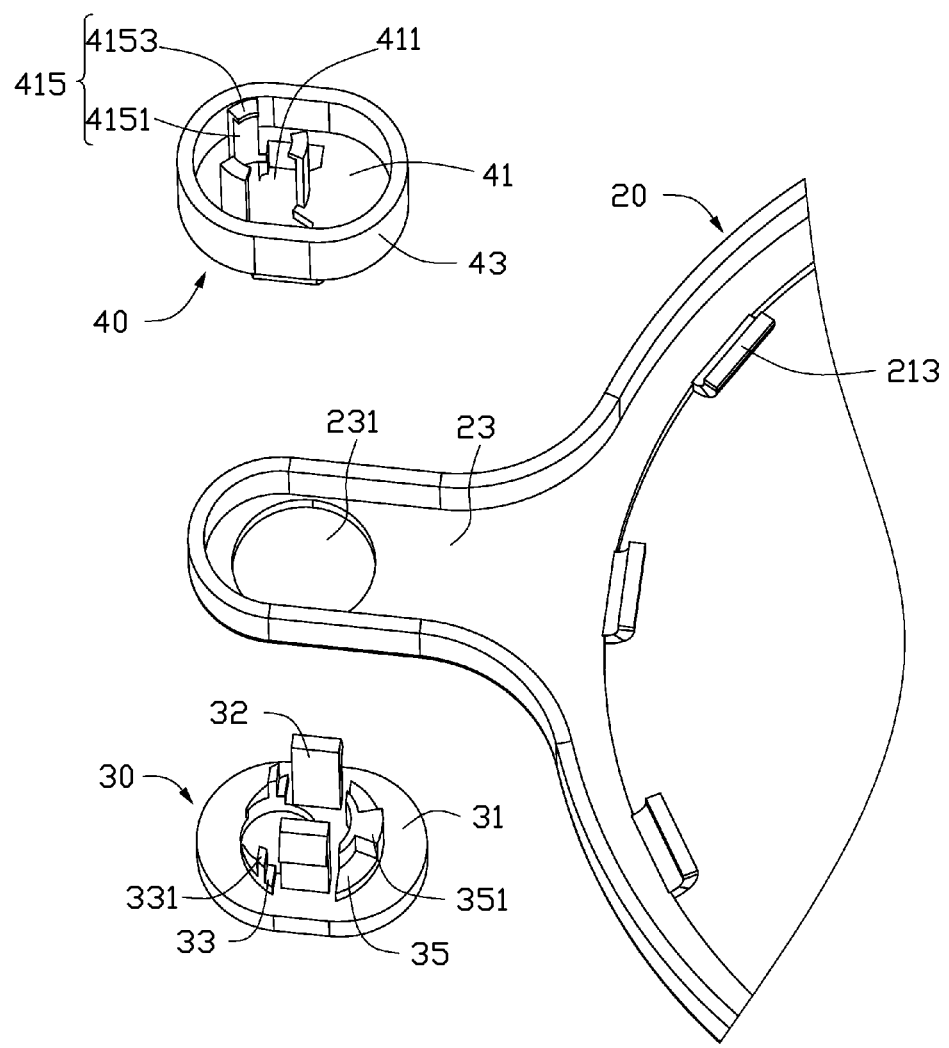
FIG. 3 is similar to FIG. 2, but viewed in a different aspect, and a bracket is partly shown.

FIGS. 2-3 show the bracket 20 including a body 21 and four mounting portions 23 extending from the body 21. In one embodiment, the body 21 is substantially circular; the four mounting portions 23 are respectively arranged at four corners of a rectangular area. The body 21 defines a circular opening 211 for receiving the base 11. A plurality of blocking portions 213 are located on an inside of the circular opening 211. Each of the four mounting portions 23 defines a mounting hole 231.

Figure 5:
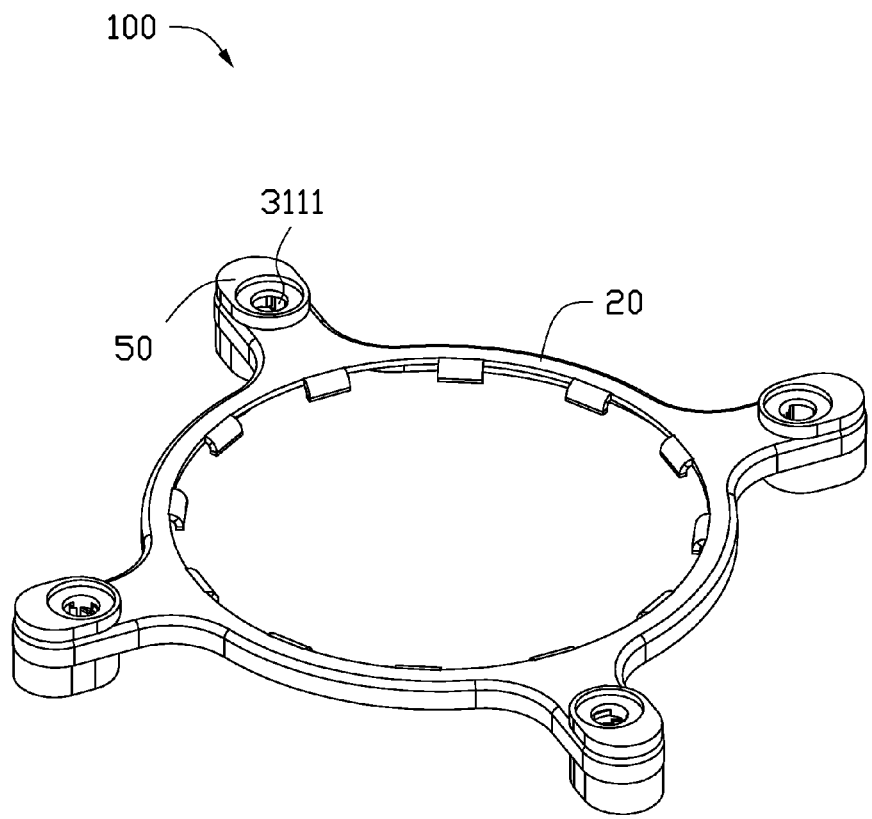
FIG. 5 is similar to FIG. 4, but an adjusting member and an installation member are shown in a different position.

FIG. 5 shows each of the four adjusting structures 50 has the same configuration, and includes an adjusting member 30 and an installation member 40 engaged with the adjusting member 30.

Figure 6:
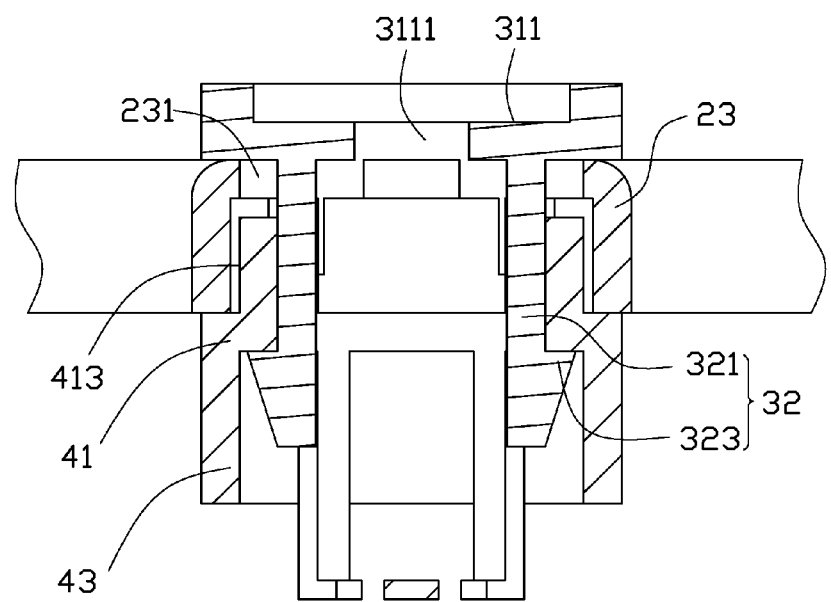
FIG. 6 is a cross-sectional view of the supporting apparatus of FIG. 4, taken along the line VI-VI.

The adjusting member 30 includes an abutting piece 31. In one embodiment, the abutting piece 31 is substantially oval-shaped. A recess 311 is defined in a front side of the abutting piece 31. A through hole 3111 is defined in the recess 311 and extends through the abutting piece 31. In one embodiment, the through hole 3111 is substantially circular, and a diameter of the through hole 3111 is smaller than a diameter of the four mounting holes 23. Two hooks 32 are located on a back side of the abutting piece 31 and placed on two sides of the through hole 3111. FIG. 6 shows each of the two hooks 32 including a positioning portion 321 connected to the abutting piece 31 and a latch portion 323. The latch portion 323 extends from a distal portion of the positioning portion 321. Two first limiting portions 33 around the through hole 3111 are located on the abutting piece 31 and placed on a first side of the two hooks 32. A second limiting portion 35 is located on the abutting piece 31 and placed on a second side of the two hooks 32 opposite to the first side of the two hooks 32. In one embodiment, an outside wall of the two first limiting portions 33 and an outside wall of the second limiting portion 35 cooperatively define a circle. A first restricting piece 331 extends from each of the two first limiting portions 33. A second restricting block 351 extends from the second limiting portion 35.

FIGS. 2-3 show the installation member 40 including a retaining piece 41 and a preventing wall 43 extending from the retaining piece 41. A limiting hole 411 is defined in the retaining piece 41. Two resisting pieces 413 are located on a front surface of retaining piece 41 and placed at two sides of the limiting hole 411. In one embodiment, each of the two resisting pieces 413 is substantially arc-shaped. Each of the two resisting pieces 413 includes two resisting portions 4131 and a connecting portion 4133 connected to the two resisting portions 4131. Three clipping portions 415 are located on a back surface opposite to the front surface of the retaining piece 41. Each of the three clipping portions 415 includes an extending piece 4151 and a tab 4153 extending inward from the extending piece 4151. The extending piece 4151 perpendicularly connects to the retaining piece 41. In one embodiment, the three clipping portions 415 are arranged at three corners of a regular triangle area.

Figure 4:
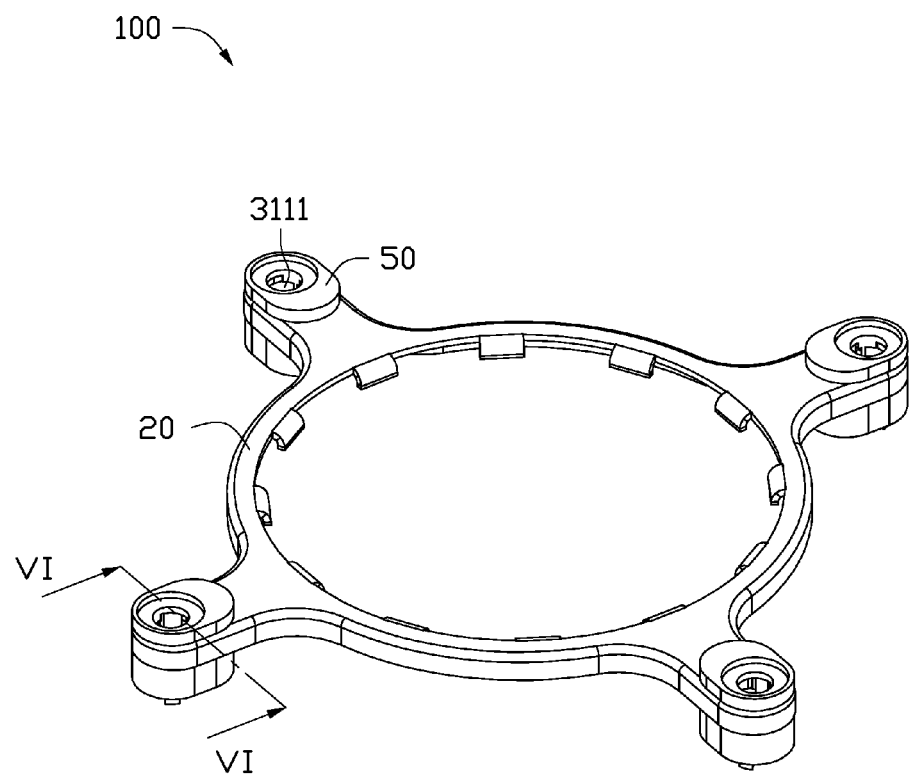
FIG. 4 is an assembled view of the supporting apparatus of FIG. 2.

FIGS. 4 and 6 show in assembly, the four adjusting structures 50 are respectively engaged with the four mounting portions 23, and the four adjusting structures 50 are assembled in the same manners, so an assembly of the four adjusting structures 50 is described below. The two hooks 32 of the adjusting member 30 are elastically inserted into the mounting hole 231. The abutting piece 31 abuts each of the four mounting portions 23, and the two first limiting portions 33 and the second limiting portion 35 are rotatably received in the mounting hole 231. The installation member 40 is placed below the bracket 20. The two hooks 32 are elastically deformed and inserted into the limiting hole 411, until the latch portions 323 of the two hooks 32 extend through the limiting hole 411. The two hooks 32 are elastically returned to engage with the retaining piece 41. The two resisting pieces 413 are respectively located between two of the first restricting pieces 331 and the second restricting block 351, and the connecting portions 433 respectively abuts against the positioning portions 321 of the two hooks 32. The outside wall of the two first limiting portions 33 and that of the second limiting portion 35 abut on an inner sidewall of the mounting hole 231. Thus, the first adjusting structure 51 is installed on the bracket 20. The adjusting members 30 are in a first position, where a first line is running through a center of the through holes 3111 of two of the four adjusting structures 50 located on opposite sides of the body 21.

Figure 7:
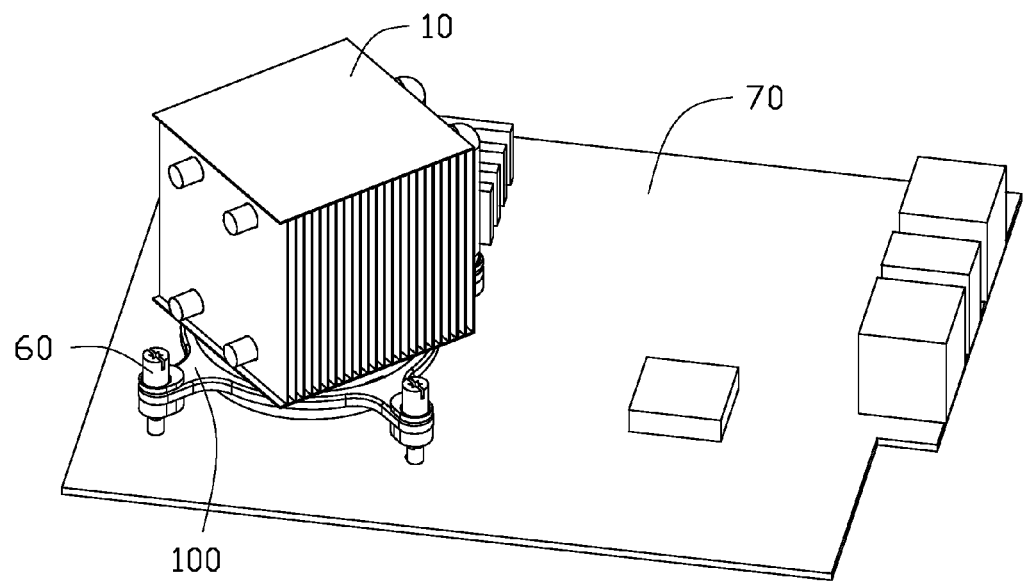
FIG. 7 is an assembled view of the supporting apparatus of FIG. 1, the heat dissipating device, the first circuit board and the four fixing members.

FIG. 7 shows the heat dissipating device 10, the base 11 inserted into the opening 211, and the heat dissipating device 10 is rotated until each of the plurality of blocking portions 213 is engaged with the corresponding one of the plurality if stopping portions 111. The heat dissipating device 10 abuts the bracket 20. A fixing member 60 is inserted into the through hole 3111, the mounting hole 231, and the limiting hole 411 and engaged among the three clipping portions 45.

When the heat dissipating device 10 is used to dissipate heat generated from an electronic component (not shown) of a first circuit board 70, the heat dissipating device 10 and the supporting apparatus 100 are installed on the first circuit board 70. The fixing members 60 are inserted into threaded holes 71 defined in the first circuit board 70.

When the heat dissipating device 10 is used to dissipate heat from a second circuit board (not shown), and positions of the threaded holes in the second circuit board are different from that of the first circuit board 70. The adjusting member 30 is rotated, until the fixing member 60 is aligned with the threaded hole. Shown in FIG. 5, the through hole 3111 is in second position, where a second line is running through a center of the through holes 3111 of the two of the four adjusting structures 50. A length of the first line is greater than that of the second line. A distance is defined between the through hole 3111 of the first adjusting structure 51 in the first position and the same through hole 3111 in the second position, and the number of the distance is larger than zero.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A heat dissipating device supporting apparatus comprising:
   a bracket, the bracket comprising a body configured to support a heat dissipating device and two mounting portions extending from two opposite sides of the body, each of the two mounting portions defining a mounting hole;
   two adjusting structures engaged in each of the mounting holes, each of the two adjusting structures comprising an adjusting member and an installation member detachably engaged with the adjusting member, a through hole being defined in the adjusting member;
   wherein each adjusting member comprises two restricting pieces and a restricting block; the installation member comprises a resisting piece; the resisting piece is sandwiched between the restricting pieces and the restricting block; the adjusting member is rotatable relative to each of the two mounting portions from a first position to a second position; when the adjusting member is in the first position, a first line defined between centers of each of the through hole; when the adjusting members are in the second position, a second line is defined between the centers of each of the through holes, and a length of the first line is less than a length of the second line.

2. The heat dissipating device supporting apparatus of claim 1, wherein the adjusting member comprises an abutting piece, and each of the abutting pieces abut a first side of each of the two mounting portions.

3. The heat dissipating device supporting apparatus of claim 2, wherein a hook is located on the abutting piece, the installation member comprises a retaining piece defining a limiting hole, the resisting piece is located on the retaining piece, and the hook extends through the mounting hole and the limiting hole to engage with the retaining piece.

4. The heat dissipating device supporting apparatus of claim 3, wherein each of the two mounting portions is engaged between the abutting piece and the retaining piece.

5. The heat dissipating device supporting apparatus of claim 3, wherein two first limiting portions and a second limiting portion are located on the abutting piece, the restricting piece extends from each of the two first limiting portions, the restricting block extends from the second limiting portion.

6. The heat dissipating device supporting apparatus of claim 5, wherein outside walls of the two first limiting portions and an outside flange of the second limiting portion cooperatively define a circle.

7. The heat dissipating device supporting apparatus of claim 3, wherein the hook comprises a positioning portion connected to the abutting piece, the resisting piece comprises a connecting portion, and the connecting portion abuts against the positioning portion.

8. The heat dissipating device supporting apparatus of claim 3, wherein three clipping portions are located on the retaining piece, and a fixing member is inserted into the through hole, the mounting hole and the limiting hole and positioned among the three clipping portions.

9. The heat dissipating device supporting apparatus of claim 8, wherein each of the three clipping portions comprises an extending piece and a tab perpendicularly extending from the extending piece, and the fixing member is clipped by the tab of each of the three clipping portions.

10. The heat dissipating device supporting apparatus of claim 2, wherein a recess is defined in the abutting piece, and the through hole is defined in the recess and extends through the abutting piece.

11. A heat dissipating device supporting apparatus comprising:
    a bracket, the bracket comprising a body configured to support a heat dissipating device and a mounting portion extending from the body, the mounting portion defining a mounting hole;
    an adjusting structure rotatably engaged in the mounting hole, the adjusting structure comprising an adjusting member and an installation member engaged with the adjusting member, a through hole being defined in the adjusting member;
    wherein each adjusting member comprises two restricting pieces and a restricting block; the installation member comprises a resisting piece; the resisting piece is sandwiched between the restricting pieces and the restricting block; the adjusting member is rotatable relative to the mounting portion from a first position to a second position, a distance is defined between a center of the through hole when the adjusting member is in the first position and that of the through hole when the adjusting member is in the second position, and the distance is larger than zero.

12. The heat dissipating device supporting apparatus of claim 11, wherein the adjusting member comprises an abutting piece, and the abutting piece abuts a first side of the mounting portion.

13. The heat dissipating device supporting apparatus of claim 12, wherein a hook is located on the abutting piece, the installation member comprises a retaining piece defining a limiting hole, the resisting piece is located on the retaining piece, and the hook extends through the mounting hole and the limiting hole to engage with the retaining piece.

14. The heat dissipating device supporting apparatus of claim 13, wherein the retaining piece abuts a second side opposite to the first side of the mounting portion.

15. The heat dissipating device supporting apparatus of claim 13, wherein two first limiting portions and a second limiting portion are located on the abutting piece, the restricting piece extends from each of the two first limiting portions, the restricting block extends from the second limiting portion.

16. The heat dissipating device supporting apparatus of claim 15, wherein outside walls of the two first limiting portions and an outside flange of the second limiting portion cooperatively define a circle.

17. The heat dissipating device supporting apparatus of claim 13, wherein the hook comprises a positioning portion extending from the abutting piece, the resisting piece comprises a connecting portion, and the connecting portion abuts against the positioning portion.

18. The heat dissipating device supporting apparatus of claim 13, wherein three clipping portions are located on the retaining piece, and a fixing member is inserted into the through hole, the mounting hole and the limiting hole to clamp among the three clipping portions.

19. The heat dissipating device supporting apparatus of claim 18, wherein each of the three clipping portions comprises an extending piece and a tab extending from the extending piece, and the fixing member is clipped by the tab of each of the three clipping portions.

20. The heat dissipating device supporting apparatus of claim 12, wherein a recess is defined in the abutting piece, and the through hole is defined in the recess through the abutting piece.

* * * * *